US012442079B2

(12) United States Patent
Iyengar et al.

(10) Patent No.: US 12,442,079 B2
(45) Date of Patent: Oct. 14, 2025

(54) DUAL CHANNEL SHOWERHEAD ASSEMBLY

(71) Applicant: Applied Materials, Inc., Santa Clara, CA (US)

(72) Inventors: Prahallad Iyengar, Santa Clara, CA (US); Dhritiman Subha Kashyap, Bangalore (IN); Parth Swaroop, Karnataka (IN); Satish Radhakrishnan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 757 days.

(21) Appl. No.: 17/699,971

(22) Filed: Mar. 21, 2022

(65) Prior Publication Data

US 2023/0294116 A1 Sep. 21, 2023

(51) Int. Cl.
*C23C 16/455* (2006.01)

(52) U.S. Cl.
CPC ...... *C23C 16/45565* (2013.01); *C23C 16/455* (2013.01); *C23C 16/45574* (2013.01)

(58) Field of Classification Search
CPC ................................................ C23C 16/45565
USPC ........................................ 156/345.33–345.34
See application file for complete search history.

(56) References Cited

U.S. PATENT DOCUMENTS 6,106,625 A * 8/2000 Koai ..................... C23C 16/455 118/724
8,133,323 B2 3/2012 Kakegawa
9,064,909 B2 6/2015 Dhindsa et al.
9,677,176 B2 * 6/2017 Chandrasekharan ..... B05B 1/18
10,354,843 B2 7/2019 Liang et al.
11,110,425 B2 9/2021 Lee et al.
2012/0009765 A1 * 1/2012 Olgado ............. C23C 16/45565 257/E21.09
2013/0280914 A1 * 10/2013 Dhindsa ............ H01J 37/32541 438/710
2014/0103145 A1 4/2014 White et al.
2015/0007770 A1 1/2015 Chandrasekharan et al.
2017/0101710 A1 * 4/2017 Chandrasekharan ........................ H01L 21/6719

(Continued)

FOREIGN PATENT DOCUMENTS

KR 20080013568 A 2/2008
KR 20080022699 A 3/2008

OTHER PUBLICATIONS

PCT International Search Report and Written Opinion in PCT/US2023/015787 dated Jul. 17, 2023, 11 pages.

*Primary Examiner* — Aiden Lee
(74) *Attorney, Agent, or Firm* — Servilla Whitney LLC

(57) ABSTRACT

Dual channel showerhead assemblies are described. In some embodiments, the dual channel showerhead assemblies, which include a showerhead upper plate and a showerhead lower plate, enable delivery of mutually incompatible precursors along separate channels that mix in the process zone above a wafer. The dual channel showerhead assemblies provide at least two separate gas paths. In some embodiments, the hole design and hole distribution are configured for minimal jetting effect and plenum volumes for fast purging. The dual channel showerhead assemblies described herein may have a reduced purge out time compared to single channel showerheads, spiral dual channel showerheads, and bonded dual channel showerheads.

12 Claims, 6 Drawing Sheets

(56) References Cited

U.S. PATENT DOCUMENTS

2021/0187521 A1* 6/2021 Mustafa ............ C23C 16/45574

* cited by examiner

DUAL CHANNEL SHOWERHEAD ASSEMBLY

TECHNICAL FIELD

Embodiments of the disclosure generally relate to showerheads for processing chambers. More particularly, embodiments of the disclosure are directed to dual channel showerhead assemblies with mutually isolated plenums for separation of incompatible gases during delivery.

BACKGROUND

Many deposition processes used in the manufacture of semiconductors employ incompatible gases. Incompatible gases contain species that are reactive with each other. For example, chemical vapor deposition (CVD) and atomic layer deposition (ALD) processes employ incompatible gases to deposit films. A CVD process mixes the incompatible gases in the process chamber above a substrate surface. In a simple example, a chemical reaction between the incompatible gases results in a species that deposits on the substrate surface. Common incompatible gases include, but are not limited to, oxidizing agents and reducing agents.

For a controlled reaction to occur, the incompatible gases must remain in separate gas streams in the gas lines and showerhead to prevent interstitial reactions with the process chamber components. Current state of the art designs include either brazed parallel plates (expensive and difficult to manufacture) or spiral channel designs (long purge out times & poor uniformity tuneability). Uniformity of gas delivery, prevention of micro nonuniformities below the holes and improving the cycle time are some of the additional concerns addressed by this design.

There is, therefore, a need in the art for showerheads that can uniformly deliver incompatible gases, prevent micro nonuniformities below the holes, and improve cycle time.

SUMMARY

One or more embodiments of the disclosure are directed to a dual channel showerhead assembly. In some embodiments, the dual channel showerhead assembly includes a thermal base having a back surface and a front surface defining a thickness of the thermal base, and at least one first gas channel extending through the thickness of the thermal base to the front surface and at least one second gas channel extending through the thickness of the thermal base to the front surface. In some embodiments, the dual channel showerhead assembly includes a showerhead upper plate having a back surface and a front surface defining a thickness of the showerhead upper plate, a portion of the back surface of the showerhead upper plate spaced a distance from a portion of the front surface of the thermal base to form an upper plenum. The at least one first gas channel of the thermal base has an aperture in the front surface of the thermal base at the portion forming the upper plenum. The dual channel showerhead assembly includes an outer peripheral region of the back surface of the showerhead upper plate in contact with an outer peripheral region of the front surface of the thermal base. The at least one second gas channel of the thermal base has an aperture aligned with at least one second gas channel passing through the thickness of the showerhead upper plate to an aperture formed in the front surface of the showerhead upper plate. The front surface of the showerhead upper plate has a plurality of spaced gas bosses extending from the front surface of showerhead upper plate, each of the gas bosses having a gas boss outer perimeter wall and a gas boss front surface. The showerhead upper plate has a plurality of first gas channels extending from the back surface to apertures in the gas boss front surface. The dual channel showerhead assembly includes a showerhead lower plate having a back surface and a front surface defining a thickness of the showerhead lower plate. A portion of the back surface of the showerhead lower plate is spaced a distance from a portion of the front surface of the showerhead upper plate to form a lower plenum. The dual channel showerhead assembly includes an outer peripheral region of the back surface of the showerhead lower plate in contact with an outer peripheral region of the front surface of the showerhead upper plate and a plurality of lower openings extending through the thickness of the showerhead lower plate. The plurality of lower openings are aligned with the plurality of spaced gas bosses of the showerhead upper plate, each of the plurality of lower openings having a lower opening wall sized to provide a gap between the gas boss outer perimeter wall and the lower opening wall to allow a flow of gas from the lower plenum to pass through the thickness of the showerhead lower plate.

Additional embodiments of the disclosure are directed to a dual channel showerhead assembly. In some embodiments, the dual channel showerhead assembly includes a thermal base having a back surface and a front surface defining a thickness of the thermal base, and at least one first gas channel extending through the thickness of the thermal base to the front surface and at least one second gas channel extending through the thickness of the thermal base to the front surface. In some embodiments, the dual channel showerhead assembly includes a showerhead upper plate having a back surface and a front surface defining a thickness of the showerhead upper plate, a portion of the back surface of the showerhead upper plate spaced a distance from a portion of the front surface of the thermal base to form an upper plenum. The at least one first gas channel of the thermal base has an aperture in the front surface of the thermal base at the portion forming the upper plenum. The dual channel showerhead assembly includes an outer peripheral region of the back surface of the showerhead upper plate in contact with an outer peripheral region of the front surface of the thermal base. The at least one second gas channel of the thermal base has an aperture aligned with at least one second gas channel passing through the thickness of the showerhead upper plate to an aperture formed in the front surface of the showerhead upper plate. The front surface of the showerhead upper plate has a plurality of spaced gas bosses extending from the front surface of showerhead upper plate, each of the gas bosses having a gas boss outer perimeter wall and a gas boss front surface. The showerhead upper plate has a plurality of first gas channels extending from the back surface to apertures in the gas boss front surface. The dual channel showerhead assembly includes a showerhead lower plate having a back surface and a front surface defining a thickness of the showerhead lower plate. A portion of the back surface of the showerhead lower plate is spaced a distance from a portion of the front surface of the showerhead upper plate to form a lower plenum. The dual channel showerhead assembly includes an outer peripheral region of the back surface of the showerhead lower plate in contact with an outer peripheral region of the front surface of the showerhead upper plate and a plurality of lower openings extending through the thickness of the showerhead lower plate. The plurality of lower openings are aligned with the plurality of spaced gas bosses of the showerhead upper plate, each of the plurality of lower openings having a lower opening wall sized to provide a gap between the gas boss outer perimeter wall and the lower opening wall to allow a flow of gas from the lower plenum to pass through the thickness of the showerhead lower plate. The dual channel showerhead assembly includes an outer ring around the thermal base. The outer ring has an inner diameter surface and a lower surface. The inner diameter surface is spaced a distance from an outer diameter surface of the thermal base to form an exhaust plenum.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
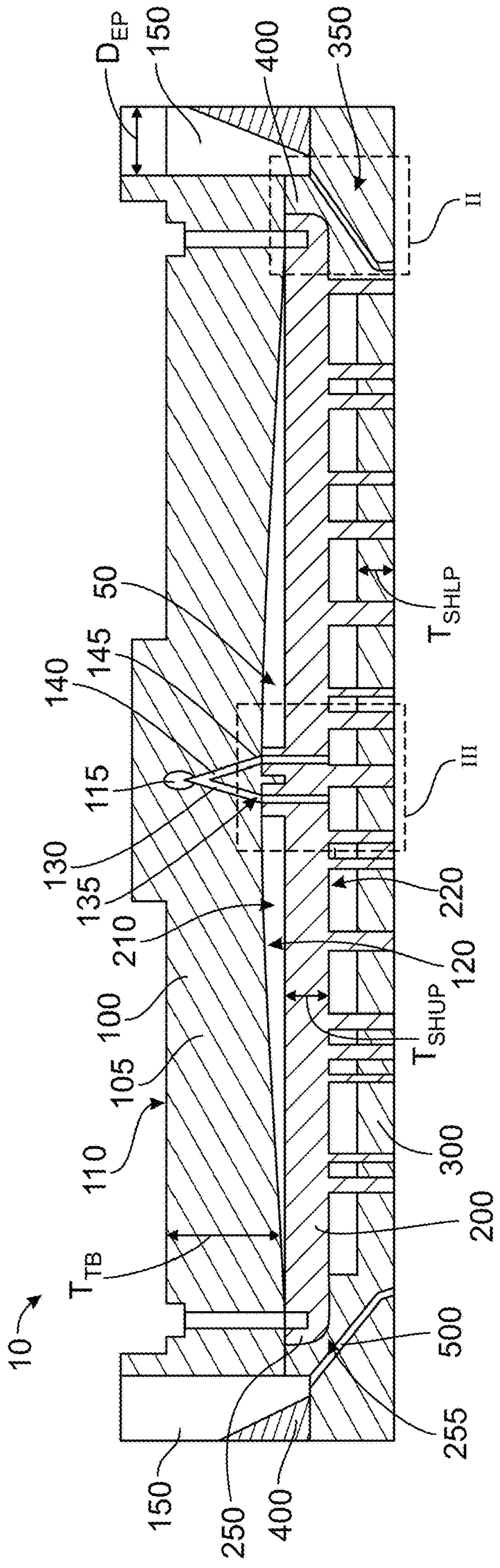
FIG. 1 illustrates a schematic cross-sectional view of a dual channel showerhead assembly according to one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

As used in this specification and appended claims, use of relative terms like "above" and "below" should not be taken as limiting the scope of the disclosure to a physical orientation in space. Accordingly, use of relative terms should not be limited to the direction specified by gravity.

Current state of the art designs include either brazed parallel plates (expensive and difficult to manufacture) or spiral channel designs (long purge out times & poor uniformity tuneability). Embodiments of a dual channel showerhead assembly described herein utilize a multi-stage conical (or straight) holes of specific dimensions optimized to minimize jetting while maintaining ease of manufacturing. Optimization of size, shape and distribution of bosses to minimize dead zones/flow recirculation and enable faster cycle times for dose and purge.

Embodiments of the disclosure provide dual channel showerhead assemblies that enable delivery of mutually incompatible precursors along separate channels that mix in the process zone above the wafer. In some embodiments, the hole design and hole distribution are configured for minimal jetting effect and plenum volumes for fast purging. Some embodiments have bosses with holes either between bosses or as annular spaces around bosses for uniform gas delivery and mixing above wafer.

One or more embodiments of the disclosure provide dual channel showerhead assemblies having effective gas separation, high radial and/or azimuthal uniformity, faster purge efficiency and thus wafer throughput, gas delivery and purging to the wafer edge, lower manufacturing costs and/or improved refurbishment costs. Some embodiments have a low pressure drop for gas flow in plenum vs holes ($\Delta P$). Some embodiments constrain precursor spreading to minimize deposition on chamber parts for low product cost of ownership.

Some embodiments of the dual channel showerhead assembly comprise a showerhead with two center feeds with individual ALD valves. In some embodiments, the upper plenum has holes drilled through bosses opening directly in the process space. The bosses are bonded to the bottom faceplate, effectively sealing the lower plenum. The lower plenum has holes drilled between the bosses.

The disclosure provides dual channel showerhead assemblies for use with single substrate processing chambers or multi-substrate (also referred to as batch) processing chambers. FIG. 1 illustrates a schematic cross-sectional view of a dual channel showerhead assembly 10. In some embodiments, the dual channel showerhead assembly 10 includes a thermal base 100 having a back surface 110 and a front surface 120. The back surface 110 and the front surface 120 define a thickness $T_{TB}$ of the thermal base 100. In some embodiments, the thickness $T_{TB}$ of the thermal base 100 is in a range of from 100 mm to 500 mm.

Figure 2:
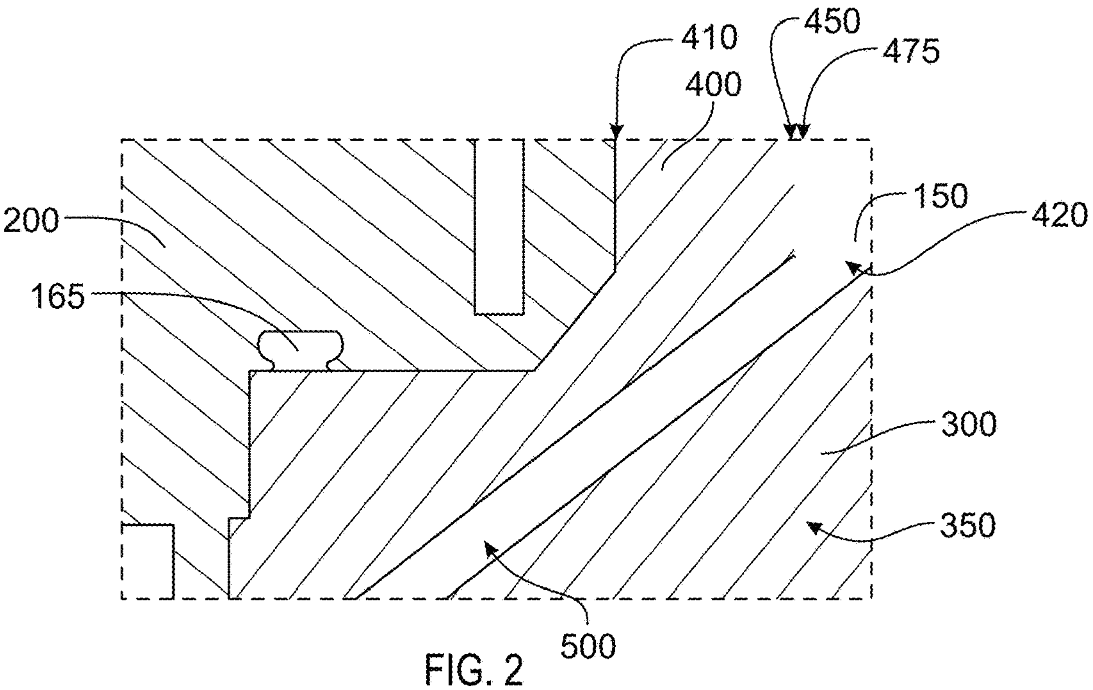
FIG. 2 illustrates an enlarged view of region II of FIG. 1.

FIG. 2 illustrates an enlarged view of region II of FIG. 1. In some embodiments, the dual channel showerhead assembly 10 includes an outer ring 400 around the thermal base 100. The outer ring 400 has an inner diameter surface 410 and a lower surface 420. Referring to FIGS. 1 and 2, in some embodiments, the inner diameter surface 410 is spaced a distance $D_{EP}$ from an outer diameter surface 450 of the thermal base 100 to form an exhaust plenum 500. In some embodiments, the outer diameter surface 450 of the thermal base 100 is adjacent an inner wall 475 of the exhaust plenum 500. In some embodiments, the exhaust plenum 500 is connected to or in fluid communication with a vacuum source.

Referring to FIGS. 1 and 3-5, the thermal base 100 has at least one first gas channel 130 extending through the thickness $T_{TB}$ of the thermal base 100 to the front surface 120 and at least one second gas channel 140 extending through the thickness $T_{TB}$ of the thermal base 100 to the front surface 120.

In some embodiments, the at least one first gas channel 130 and the at least one second gas channel 140 each define a separate gas path. In some embodiments, the dual channel showerhead assembly 10 enables delivery of mutually incompatible precursors along separate channels (i.e., the at least one first gas channel 130 and the at least one second gas channel 140) that mix in the process zone above the wafer. In the illustrated embodiment of FIG. 1, the dual channel showerhead assembly 10 has the at least one first gas channel 130 on the left side and the at least one second gas channel 140 on the right side. The skilled artisan will recognize that the particular arrangement of the at least one first gas channel 130 and the at least one second gas channel 140 is merely exemplary and should not be taken as limiting the scope of the disclosure.

In some embodiments, one or more of the at least one first gas channel 130 or the at least one second gas channel 140 is angled. In some embodiments, one or more of the at least one first gas channel 130 or the at least one second gas channel 140 is has an angle in a range of from 0 degrees to 45 degrees. In some embodiments, one or more of the at least one first gas channel 130 or the at least one second gas channel 140 has an angle in a range of from 5 degrees to 40 degrees, in a range of from 10 degrees to 35 degrees, or in a range of from 15 degrees to 30 degrees. The at least one first gas channel 130 and the at least one second gas channel 140 may define any suitable shape known to the skilled artisan. Referring to FIGS. 1, 3-5, and 6B, the at least one first gas channel 130 and the at least one second gas channel 140 have an elliptical shape, eye shape, a tear-drop shape, or a round cross-section.

Current state of the art designs include either brazed parallel plates (expensive and difficult to manufacture) or spiral channel designs (long purge out times & poor uniformity tuneability). Embodiments of the disclosure advantageously provide a dual channel showerhead assembly 10 having a showerhead upper plate 200 and a showerhead lower plate 300. The inventors have surprisingly found that the dual channel showerhead assembly 10 having the showerhead upper plate 200 and the showerhead lower plate 300 has a reduced purge out time compared to each of a single channel showerhead, a spiral dual channel showerhead, or a bonded dual channel showerhead.

Referring to FIGS. 7A-7B and 8A-8B, in some embodiments, each of the showerhead upper plate 200 and the showerhead lower plate 300 are individually mounted to the thermal base 100. The showerhead upper plate 200 has a plurality of mounting holes 294 and the showerhead lower plate 300 has a plurality of mounting holes 394. The showerhead upper plate 200 and the showerhead lower plate 300 may be mounted to the thermal base 100 by any suitable means. In some embodiments, a plurality of bolts is used to mount each of the showerhead upper plate 200 and the showerhead lower plate 300 to the thermal base 100. The plurality of bolts extend through the plurality of mounting holes 294 in the showerhead upper plate 200 to the thermal base 100 to form a mounting connection. In some embodiments, the plurality of mounting holes 294 are angled. The plurality of bolts extend through the plurality of mounting holes 394 in the showerhead lower plate 300 to the thermal base 100 to form a mounting connection. In some embodiments, the plurality of bolts extend through the angled plurality of mounting holes 394 in the showerhead lower plate 300 to the thermal base 100 to form a mounting connection. In some embodiments, the plurality of bolts used to mount the showerhead upper plate 200 to the thermal base 100 includes 12 bolts. In some embodiments, the plurality of bolts used to mount the showerhead lower plate 300 to the thermal base 100 includes 12 bolts.

Referring to FIGS. 1 and 3-5, the showerhead upper plate 200 has a back surface 210 and a front surface 220. The back surface 210 and the front surface 220 define a thickness $T_{SHUP}$ of the showerhead upper plate 200. In some embodiments, the thickness $T_{SHUP}$ of the showerhead upper plate 200 is in a range of from 6 mm to 20 mm. In some embodiments, the dual channel showerhead assembly 10 includes a portion of the back surface 210 of the showerhead upper plate 200 that is spaced a distance from a portion of the front surface 120 of the thermal base 100 to form an upper plenum 50. The at least one first gas channel 130 of the thermal base 100 has an aperture 135 in the front surface 120 of the thermal base 100 at the portion forming the upper plenum 50. In some embodiments, the distance forming the upper plenum 50 is less than or equal to 20 mm. In some embodiments, the thermal base 100 has a sloped front face 105 and the distance forming the upper plenum 50 increases toward a center 115 of the thermal base 100.

Referring again to FIGS. 1 and 2, in some embodiments, the dual channel showerhead assembly 10 includes an outer peripheral region 250 of the back surface 210 of the showerhead upper plate 200 in contact with an outer peripheral region 150 of the front surface 120 of the thermal base 100. In some embodiments, there is a plurality of o-rings 165 configured to seal the aperture 135 in the front surface of the thermal base 100 and the aperture 145 in the front surface 120 of the thermal base 100.

The at least one second gas channel 140 of the thermal base 100 has an aperture 145 aligned with at least one second gas channel 240 passing through the thickness $T_{SHUP}$ of the showerhead upper plate 200 to an aperture 245 formed in the front surface 220 of the showerhead upper plate 200.

Figure 3:
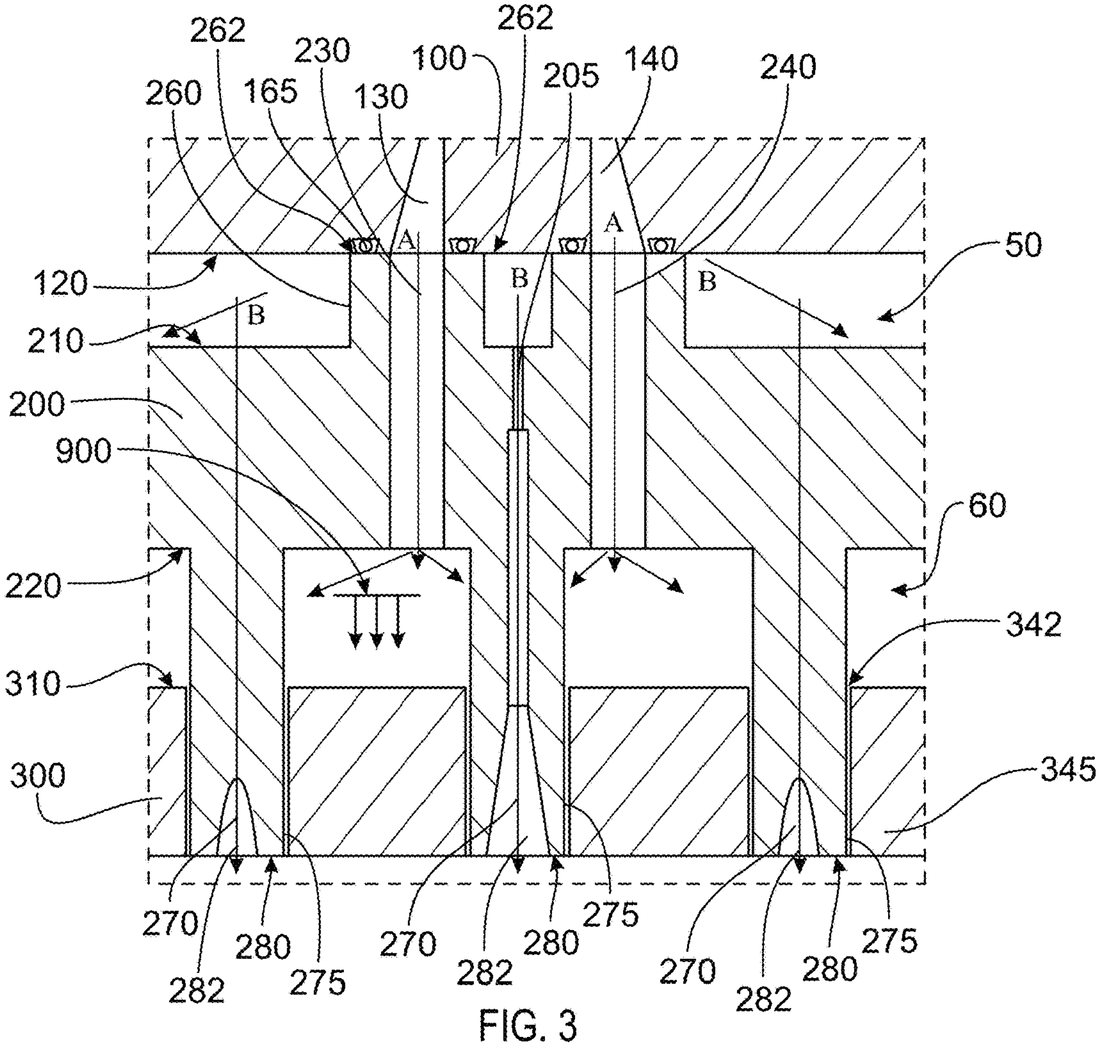
FIG. 3 illustrates an enlarged view of region III of FIG. 1 according to one or more embodiments of the disclosure.
Figure 4:
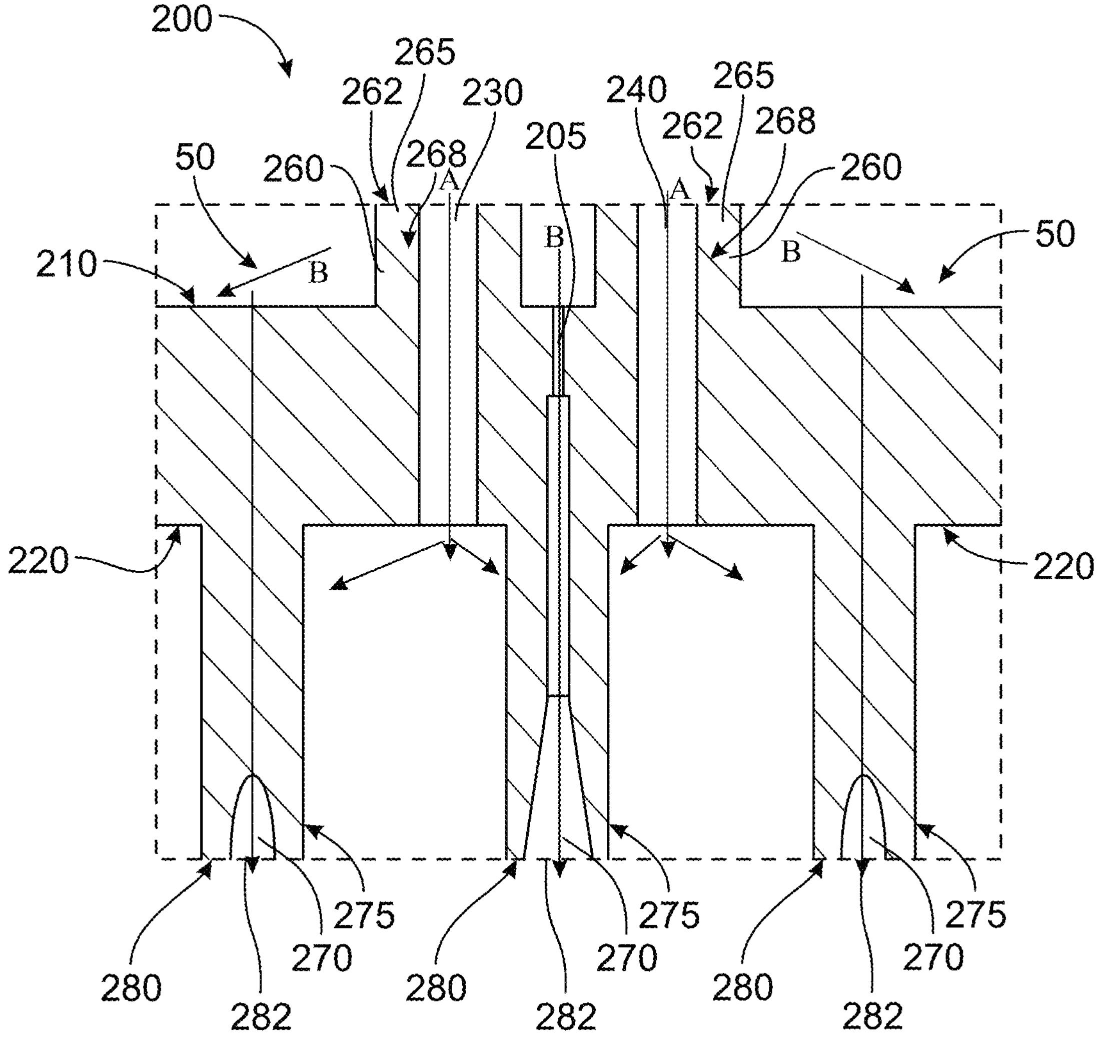
FIG. 4 illustrates schematic view of a showerhead upper plate according to one or more embodiments of the disclosure.
Figure 5:
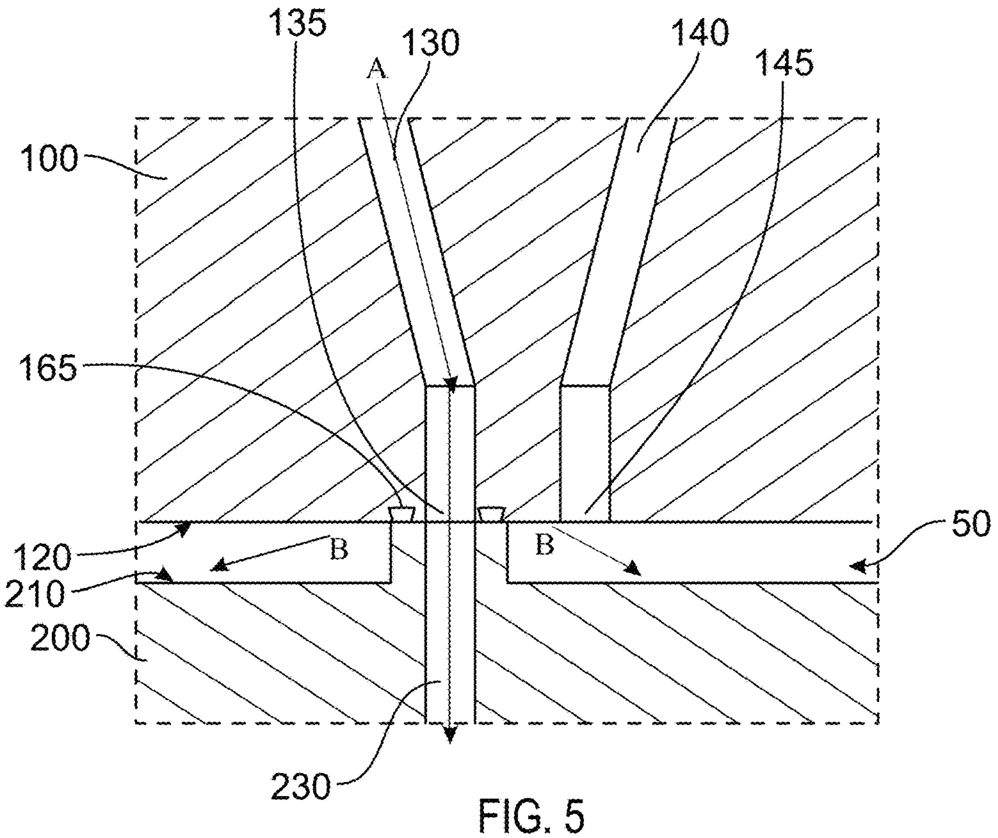
FIG. 5 illustrates an enlarged view of region III of FIG. 1 according to one or more embodiments of the disclosure.
Figure 6A:
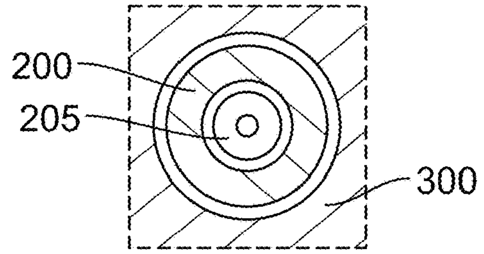
FIG. 6A illustrates an enlarged top view of a gas channel according to one or more embodiments of the disclosure.
Figure 6B:
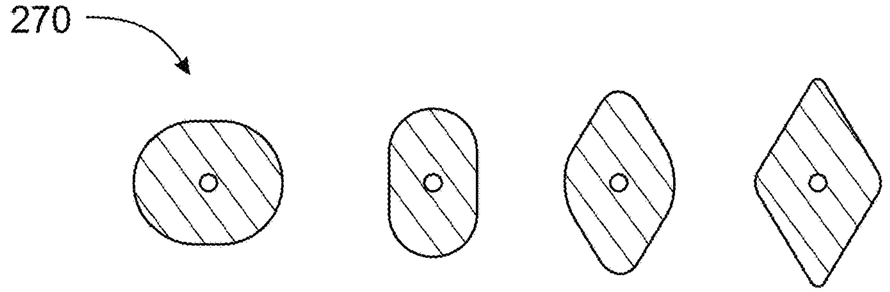
FIG. 6B illustrates an enlarged view of a gas boss according to one or more embodiments of the disclosure.

FIG. 3 illustrates an enlarged view of region III of FIG. 1. FIG. 4 illustrates schematic view of the showerhead upper plate 200. In some embodiments, the back surface 210 of the showerhead upper plate 200 has at least one first gas channel 230 and at least one second gas channel 240. In some embodiments, the at least one first gas channel 230 and the at least one second gas channel 240 extend from the back surface 210 to the front surface 220. In some embodiments, the at least one first gas channel 230 and the at least one second gas channel 240 are in contact with the at least one first gas channel 130 and the at least one second gas channel 140 of the thermal base 100. The at least one first gas channel 230 can be straight or angled. In some embodiments, when the at least one first gas channel 230 is angled, the at least one first gas channel 230 has an angle of less than or equal to 45 degrees. Without intending to be bound by any particular theory of operation, the at least one first gas channel 230 having an angle of less than or equal to 45 degrees is designed to prevent direct flow impingement at the center 115 of the thermal base 100.

Embodiments of the dual channel showerhead assembly 10 provide at least two separate gas paths (i.e., gas path A and gas path B). As used herein, "gas path A" refers to a path that is formed by flowing a gas through the at least one first gas channel 130 and the at least one second gas channel 140 of the thermal base 100 that continues to flow through to the at least one first gas channel 230 and the at least one second gas channel 240 of the showerhead upper plate 200. As used herein, "gas path B" refers to a path that is formed by flowing a gas through the at least one first gas channel 130 and the at least one second gas channel 140 of the thermal base 100 that passes through to the upper plenum 50. In some embodiments, a first gas is flowed along gas path A and a second gas is flowed along gas path B. In some embodiments, the first gas and the second gas as incompatible. The skilled artisan will recognize that the particular arrangement of flowing the first gas along gas path A and the second gas along gas path B is merely exemplary and should not be taken as limiting the scope of the disclosure. In some embodiments, the first gas is flowed along gas path B and the second gas is flowed along gas path A.

In some embodiments, the flow of gas that passes through the at least one first gas channel 130 of the thermal base 100 will pass through the at least one first gas channel 230 of the showerhead upper plate 200 to the front surface 220 of the showerhead upper plate 200 (i.e., gas path A). In some embodiments, a flow of gas that passes through the at least one second gas channel 140 of the thermal base 100 will pass through the at least one second gas channel 240 of the showerhead upper plate 200 to the front surface 220 of the showerhead upper plate 200 (i.e., gas path A).

In the illustrated embodiment of FIG. 3, the front surface 220 of the showerhead upper plate 200 has a plurality of spaced gas bosses 270 extending from the front surface 220 of showerhead upper plate 200. In some embodiments, each of the plurality of spaced gas bosses 270 have a gas boss outer perimeter wall 275 and a gas boss front surface 280. In some embodiments, the plurality of spaced gas bosses 270 is staggered within the front surface 220 of the showerhead upper plate 200. The design and arrangement of the plurality of spaced gas bosses 270 within the front surface 220 of the showerhead upper plate 200 may be optimized to obtain the lowest gas flow recirculation in the upper plenum 50 and lowest shear stress. The design and arrangement of the plurality of spaced gas bosses 270 within the front surface 220 of the showerhead upper plate 200 may be optimized to obtain the lowest gas flow recirculation in the lower plenum 60 and lowest shear stress. The design and arrangement of the bosses is optimized for lowest flow recirculation in the plenum and lowest shear and fastest gas evacuation. The azimuthal positions of the plurality of spaced gas bosses 270 in each gas boss outer perimeter wall 275 is chosen to optimize an arrangement configured to prevent a dominant flow pattern (e.g., gas path A or gas path B) at the center 115 of the thermal base 100. The azimuthal positions are also used to create a uniform flow distribution over the surface of the substrate.

In some embodiments, the plurality of spaced gas bosses 270 is not bonded to either of the showerhead upper plate 200 or the showerhead lower plate 300. In the illustrated embodiment of FIG. 6B, at least one of the plurality of spaced gas bosses 270 has the same shape as one or more of the at least one first gas channel 130 or the at least one second gas channel 140. In the illustrated embodiment of FIG. 6B, at least one of the plurality of spaced gas bosses 270 have an elliptical shape, eye shape, a tear-drop shape, or a round cross-section. has an elliptical shape, an eye shape, a tear-drop shape, or a cylindrical shape. In some embodiments, the plurality of spaced gas bosses 270 has in a range of from 50 to 1000 bosses. In some embodiments, at least one of the plurality of spaced gas bosses 270 has a diameter in a range of from 2 mm to 8 mm, including in a range of from 2.5 mm to 7.5 mm, in a range of from 3 mm to 7 mm, or in a range of from 3.5 mm to 6.5 mm.

In some embodiments, the showerhead upper plate 200 has an upper extension boss 260 with a second opening 265 having an aperture 268 in a back surface 262 of the upper extension boss 260. In some embodiments, the upper extension boss 260 is configured to maintain the portion of the back surface 210 of the showerhead upper plate 200 that is spaced a distance from the portion of the front surface 120 of the thermal base 100 that forms the upper plenum 50.

In some embodiments, a portion of the gas flowed through the at least one first gas channel 130 and the at least one second gas channel 140 passes through to the upper plenum 50 (i.e., gas path B). In some embodiments, the gas in the upper plenum 50 flows through the back surface 210 of the showerhead upper plate 200 to the front surface 220 of the showerhead upper plate 200. In such embodiments, the gas flows through each of the plurality of spaced gas bosses 270. In such embodiments, the gas flows through apertures 282 in the gas boss front surface 280. In some embodiments, the gas that flows through apertures 282 in the gas boss front surface 280 continues to flow to a processing region below the dual channel showerhead assembly 10.

In some embodiments, the showerhead upper plate 200 has a plurality of first gas channels 205 extending from the back surface 210 to apertures 282 in the gas boss front surface 280. In some embodiments, the gas in the upper plenum 50 flows through the back surface 210 of the showerhead upper plate 200 by way of the plurality of first gas channels 205 to the front surface 220 of the showerhead upper plate 200. In such embodiments, the gas flows from the plurality of first gas channels 205 through each of the plurality of spaced gas bosses 270. In such embodiments, the gas flows through apertures 282 in the gas boss front surface 280. In some embodiments, the gas that flows through apertures 282 in the gas boss front surface 280 continues to flow to a processing region below the dual channel showerhead assembly 10.

The showerhead lower plate 300 has a back surface 310 and a front surface 320. The back surface 310 and the front surface 320 define a thickness $T_{SHLP}$ of the showerhead lower plate 300. In some embodiments, the thickness $T_{SHLP}$ of the showerhead lower plate 300 is in a range of from 6 mm to 20 mm. In some embodiments, the dual channel showerhead assembly 10 includes a portion of the back surface 310 of the showerhead lower plate 300 that is spaced a distance from a portion of the front surface 220 of the showerhead upper plate 200 to form a lower plenum 60. In some embodiments, the distance forming the lower plenum 60 is less than or equal to 20 mm.

The dual channel showerhead assembly 10 includes an outer peripheral region 350 of the back surface 310 of the showerhead lower plate 300 in contact with the outer peripheral region 255 of the front surface 220 of the showerhead upper plate 200. Referring again to FIGS. 1 and 2, in some embodiments, the outer peripheral region 350 of the back surface 310 of the showerhead lower plate 300 is in contact with the lower surface 420 of the outer ring 400.

Figure 8A:
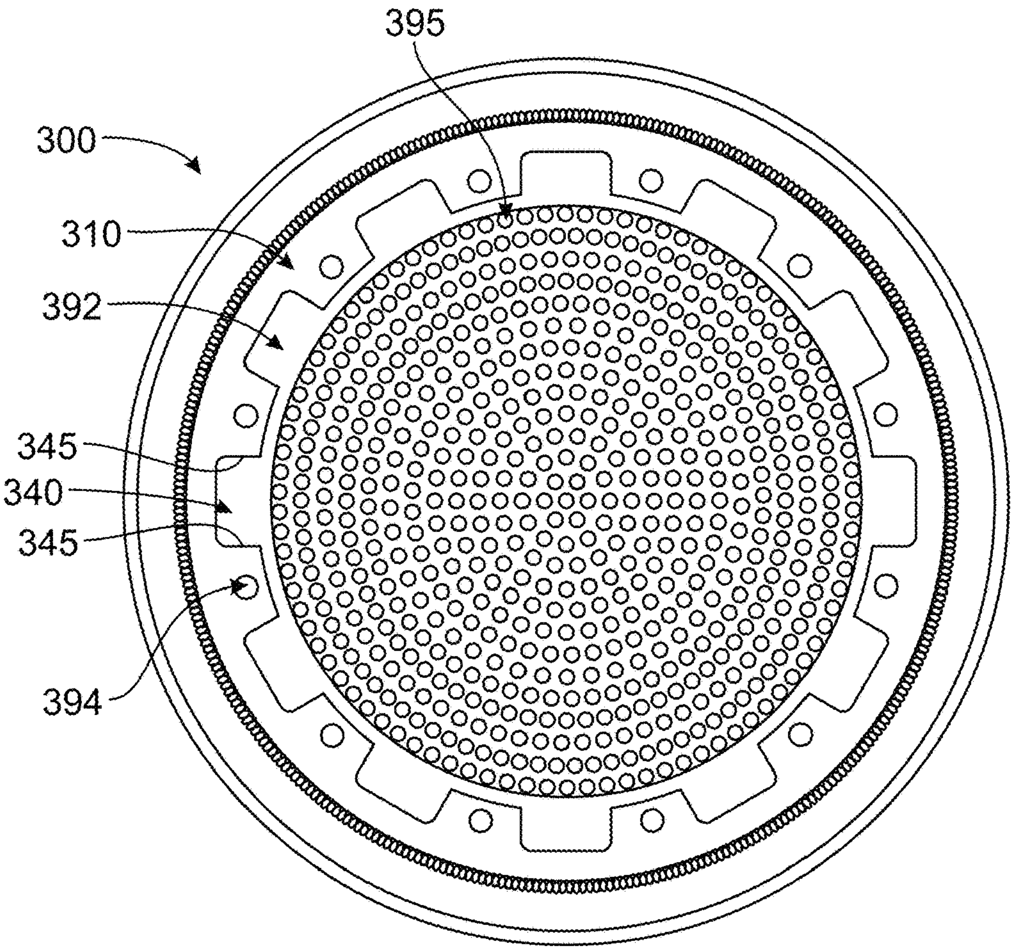
FIG. 8A illustrates a schematic bottom view of a showerhead lower plate according to one or more embodiments of the disclosure.
Figure 8B:
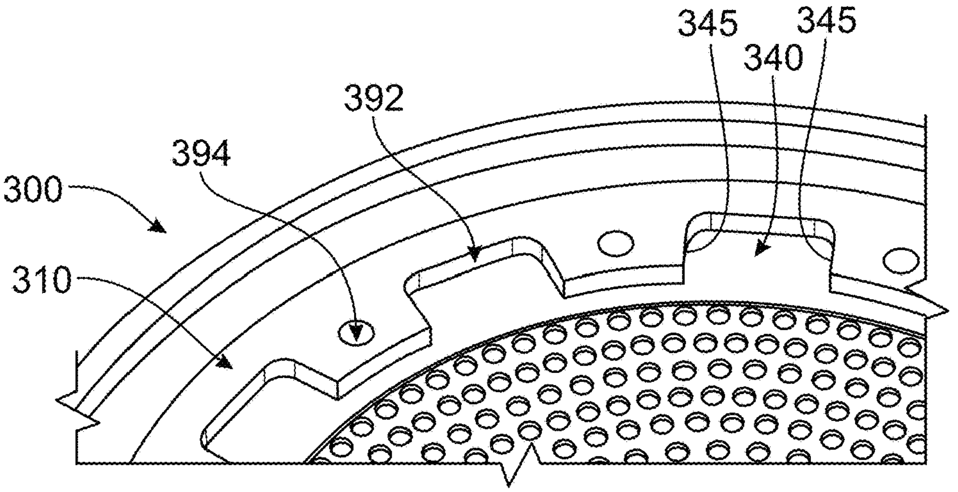
FIG. 8B illustrates a schematic partial bottom view of a showerhead lower plate according to one or more embodiments of the disclosure.

The dual channel showerhead assembly 10 includes a plurality of lower openings 340 extending through the thickness $T_{SHLP}$ of the showerhead lower plate 300. In some embodiments, the plurality of lower openings 340 are aligned with the plurality of spaced gas bosses 270 of the showerhead upper plate 200. Referring to FIGS. 8A and 8B, in some embodiments, the plurality of lower openings 340 are angled openings extending outwardly from the front surface 320 of the showerhead lower plate 300 to the back surface 310 of the showerhead lower plate 300. In some embodiments, the angled openings defining the plurality of lower openings 340 that extend outwardly from the front surface 320 of the showerhead lower plate 300 to the back surface 310 of the showerhead lower plate 300 have an angle of less than or equal to 45 degrees. In some embodiments, the angled openings defining the plurality of lower openings 340 are aligned with the plurality of spaced gas bosses 270 of the showerhead upper plate 200.

In some embodiments, the gas that flows through the at least one first gas channel 130 and the at least one second gas channel 140 of the thermal base 100, which continues to flow through the at least one first gas channel 230 and the at least one second gas channel 240 of the showerhead upper plate 200 continues to flow through the showerhead lower plate 300. In some embodiments, each of the plurality of lower openings 340 have a lower opening wall 345 sized to provide a gap 342 between the gas boss outer perimeter wall 275 and the lower opening wall 345 to allow a flow of gas denoted by a plurality of arrows 900 from the lower plenum 60 to pass through the thickness $T_{SHLP}$ of the showerhead lower plate 300. Without intending to be bound by any particular theory of operation the gap 342 between the gas boss outer perimeter wall 275 and the lower opening wall 345 controls flow uniformity of the lower plenum 60. In some embodiments, the gap 342 between the gas boss outer perimeter wall 275 and the lower opening wall 345 is in a range of from 0.1 mm to 3 mm.

FIGS. 7A-8B illustrate schematic views of the showerhead upper plate 200 and the showerhead lower plate 300. In some embodiments, the hole design and hole distribution are configured for minimal jetting effect and upper plenum 50 and lower plenum 60 volumes for fast purging. Some embodiments have spaced gas bosses 270 with holes either between spaced gas bosses 270 or as annular spaces around spaced gas bosses 270 for uniform gas delivery and mixing above a wafer.

In some embodiments, each of the showerhead upper plate 200 and the showerhead lower plate 300 comprise a plurality of holes 295, 395. The plurality of holes 295 extend through the thickness $T_{SHUP}$ of the showerhead upper plate 200. The plurality of holes 395 extend through the thickness $T_{SHLP}$ of the showerhead lower plate 300. In some embodiments, the plurality of holes 295, 395 is equal to the number of the plurality of spaced gas bosses 270. In some embodiments, each of the plurality of holes 295, 395 are in alignment with each of the plurality of spaced gas bosses 270. In some embodiments, the plurality of spaced gas bosses 270 has in a range of from 50 to 1000 bosses and the plurality of holes 295, 395 is in a range of from 50 to 1000 holes. A diameter of the plurality of holes 295, 395 can be vary. In some embodiments, the diameter of each hole of the plurality of holes 295, 395 is the same. In some embodiments, one or more holes of the plurality of holes 295, 395 have a different diameter. In some embodiments, the diameter of each hole of the plurality of holes 295, 395 is in a range of from 2 mm to 8 mm, including in a range of from 2.5 mm to 7.5 mm, in a range of from 3 mm to 7 mm, or in a range of from 3.5 mm to 6.5 mm.

Figure 7A:
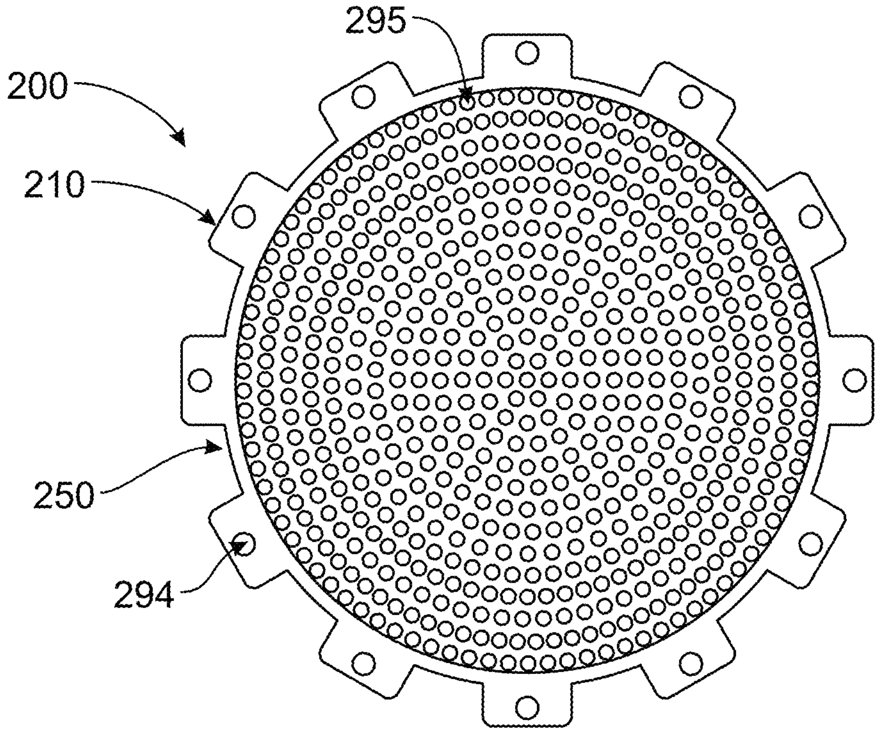
FIG. 7A illustrates a schematic top view of a showerhead upper plate according to one or more embodiments of the disclosure.
Figure 7B:
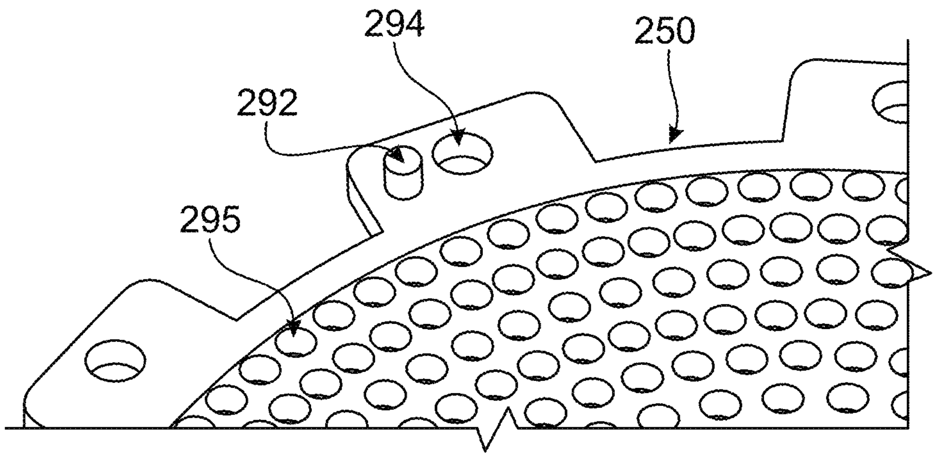
FIG. 7B illustrates a schematic partial top view of a showerhead upper plate according to one or more embodiments of the disclosure.

Referring to FIGS. 7B and 8B, in some embodiments, the showerhead upper plate 200 comprises a plurality of spaced tabs 292 extending outwardly from an outer peripheral face 290 of the showerhead upper plate 200. In some embodiments, the showerhead lower plate 300 comprises a plurality of recesses 392 sized and shaped to complement the plurality of spaced tabs 292. The plurality of spaced tabs 292 and the plurality of recesses 392 may comprise any suitable size or shape known to the skilled artisan.

Reference throughout this specification to "one embodiment," "certain embodiments," "various embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in various embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein provided a description with reference to particular embodiments, it is to be understood that these embodiments are merely illustrative of the principles and applications of the disclosure. It will be apparent to those skilled in the art that various modifications and variations can be made to the present disclosure without departing from the spirit and scope thereof. Thus, it is intended that the present disclosure include modifications and variations that are within the scope of the appended claims and their equivalents.

What is claimed is:

1. A dual channel showerhead assembly comprising:

a thermal base having a back surface and a front surface defining a thickness of the thermal base, at least one first gas channel extending through the thickness of the thermal base to the front surface and at least one second gas channel extending through the thickness of the thermal base to the front surface;

a showerhead upper plate having a back surface and a front surface defining a thickness of the showerhead upper plate, a portion of the back surface of the showerhead upper plate spaced a distance from a portion of the front surface of the thermal base to form an upper plenum, the at least one first gas channel of the thermal base having an aperture in the front surface of the thermal base at the portion forming the upper plenum, an outer peripheral region of the back surface of the showerhead upper plate in contact with an outer peripheral region of the front surface of the thermal base, the at least one second gas channel of the thermal base having an aperture aligned with at least one second gas channel passing through the thickness of the showerhead upper plate to an aperture formed in the front surface of the showerhead upper plate, the front surface of the showerhead upper plate having a plurality of spaced gas bosses extending from the front surface of showerhead upper plate, each of the gas bosses having a gas boss outer perimeter wall and a gas boss front surface, the showerhead upper plate having a plurality of first gas channels extending from the back surface of the showerhead upper plate to an aperture in the gas boss front surface;

a showerhead lower plate having a back surface and a front surface defining a thickness of the showerhead lower plate, a portion of the back surface of the showerhead lower plate spaced a distance from a portion of the front surface of the showerhead upper plate to form a lower plenum, an outer peripheral region of the back surface of the showerhead lower plate in contact with an outer peripheral region of the front surface of the showerhead upper plate, a plurality of lower openings extending through the thickness of the showerhead lower plate, the plurality of lower openings aligned with the plurality of spaced gas bosses of the showerhead upper plate, each of the plurality of lower openings having a lower opening wall sized to provide a gap between the gas boss outer perimeter wall and the lower opening wall to allow a flow of gas from the lower plenum to pass through the thickness of the showerhead lower plate: and an outer ring around the thermal base having an inner diameter surface and a lower surface, the inner diameter surface spaced a distance from an outer diameter surface of the thermal base to form an exhaust plenum, wherein the outer peripheral region of the back surface of the showerhead lower plate is in contact with the lower surface of the outer ring.

2. The dual channel showerhead assembly of claim 1, wherein each of the showerhead upper plate and the showerhead lower plate are individually mounted to the thermal base.

3. The dual channel showerhead assembly of claim 1, wherein the distance forming one or more of the upper plenum and the lower plenum is less than or equal to 20 mm.

4. The dual channel showerhead assembly of claim 1, wherein one or more of the at least one first gas channel and the at least one second gas channel is angled at less than or equal to 45 degrees.

5. The dual channel showerhead assembly of claim 1, wherein the showerhead lower plate has angled openings extending outwardly from the front surface of the showerhead lower plate to the back surface of the showerhead lower plate.

6. The dual channel showerhead assembly of claim 1, wherein the showerhead upper plate has an upper extension boss with a second opening having an aperture in a back surface of the upper extension boss.

7. The dual channel showerhead assembly of claim 1, wherein the plurality of spaced gas bosses has in a range of from 50 to 1000 bosses.

8. The dual channel showerhead assembly of claim 7, wherein at least one of the plurality of spaced gas bosses has a diameter in a range of from 2 mm to 8 mm.

9. The dual showerhead assembly of claim 1, wherein the gap between the gas boss outer perimeter wall and the lower opening wall is in a range of from 0.1 mm to 3 mm.

10. The dual showerhead assembly of claim 1, wherein the thermal base has a sloped front face and the distance forming the upper plenum increases toward a center of the thermal base.

11. The dual showerhead assembly of claim 1, wherein the showerhead upper plate comprises a plurality of spaced tabs extending outwardly from an outer peripheral face of the showerhead upper plate, and the showerhead lower plate comprises a plurality of recesses sized and shaped to complement the plurality of spaced tabs.

12. A dual channel showerhead assembly comprising:

a thermal base having a back surface and a front surface defining a thickness of the thermal base;

a showerhead upper plate having a back surface and a front surface defining a thickness of the showerhead upper plate;

a showerhead lower plate having a back surface and a front surface defining a thickness of the showerhead lower plate, a portion of the back surface of the showerhead lower plate spaced a distance from a portion of the front surface of the showerhead upper plate to form a lower plenum, an outer peripheral region of the back surface of the showerhead lower plate in contact with an outer peripheral region of the front surface of the showerhead upper plate, a plurality of lower openings extending through the thickness of the showerhead lower plate, each of the plurality of lower openings having a lower opening wall sized to provide a gap to allow a flow of gas from the lower plenum to pass through the thickness of the showerhead lower plate; and an outer ring around the thermal base having an inner diameter surface and a lower surface, the inner diameter surface spaced a distance from an outer diameter surface of the thermal base to form an exhaust plenum, wherein the outer peripheral region of the back surface of the showerhead lower plate is in contact with the lower surface of the outer ring.

* * * * *